United States Patent
Deng et al.

(10) Patent No.: US 11,867,750 B2
(45) Date of Patent: Jan. 9, 2024

(54) PROCESS VARIATION DETECTION CIRCUIT AND PROCESS VARIATION DETECTION METHOD

(71) Applicant: CHANGXIN MEMORY TECHNOLOGIES, INC., Hefei (CN)

(72) Inventors: Shengcheng Deng, Hefei (CN); Chia-Chi Hsu, Hefei (CN); Anping Qiu, Hefei (CN)

(73) Assignee: CHANGXIN MEMORY TECHNOLOGIES INC., Hefei (CN)

( * ) Notice: Subject to any disclaimer, the term of this patent is extended or adjusted under 35 U.S.C. 154(b) by 147 days.

(21) Appl. No.: 17/595,268

(22) PCT Filed: Jul. 8, 2021

(86) PCT No.: PCT/CN2021/105325
§ 371 (c)(1),
(2) Date: Nov. 12, 2021

(87) PCT Pub. No.: WO2022/134544
PCT Pub. Date: Jun. 30, 2022

(65) Prior Publication Data
US 2023/0057198 A1  Feb. 23, 2023

(30) Foreign Application Priority Data

Dec. 24, 2020 (CN) .......................... 202011550999.9

(51) Int. Cl.
*G01R 31/28* (2006.01)
(52) U.S. Cl.
CPC .............................. *G01R 31/2884* (2013.01)

(58) Field of Classification Search
CPC ............ G01R 31/2884; G01R 31/2894; G01R 31/3016
(Continued)

(56) References Cited

U.S. PATENT DOCUMENTS

| 5,811,983 A | 9/1998 | Lundberg |
| 5,923,676 A | 7/1999 | Sunter et al. |

(Continued)

FOREIGN PATENT DOCUMENTS

| CN | 1906495 A | 1/2007 |
| CN | 102075184 A | 5/2011 |
| CN | 105842604 B | 2/2019 |

OTHER PUBLICATIONS

International Search Report cited in PCT/CN2021/105325, dated Sep. 24, 2021, 10 pages.

*Primary Examiner* — Giovanni Astacio-Oquendo
(74) *Attorney, Agent, or Firm* — Cooper Legal Group, LLC (57) ABSTRACT

The present disclosure provides a process variation detection circuit and a process variation detection method. The process variation detection circuit is arranged in a chip and includes: a first ring oscillator, where a first number of auxiliary elements of a preset type are arranged between two adjacent inverters of the first ring oscillator; and a second ring oscillator, where a second number of auxiliary elements of a preset type are arranged between two adjacent inverters of the second ring oscillator, the second number is larger than the first number; wherein, a number of the inverter of the first ring oscillator is the same as a number of the inverter of the second ring oscillator; a type and a size of a transistor of the first ring oscillator are the same as a type and a size of a transistor of the second ring oscillator.

5 Claims, 6 Drawing Sheets

(58) Field of Classification Search
USPC .................................. 324/762.01, 537, 500
See application file for complete search history.

(56) References Cited

U.S. PATENT DOCUMENTS

| | | |
|---|---|---|
| 7,109,734 B2 | 9/2006 | Yuan et al. |
| 8,330,478 B2 | 12/2012 | Myers et al. |
| 11,063,794 B2* | 7/2021 | Shibata .................. G11C 27/02 |
| 2008/0120065 A1* | 5/2008 | Joshi .................. G01R 31/2884 |
| | | 702/182 |
| 2014/0218060 A1* | 8/2014 | Saneyoshi .......... G01R 31/3187 |
| | | 324/762.01 |
| 2015/0233979 A1* | 8/2015 | Barrenscheen .. G01R 19/16547 |
| | | 324/120 |
| 2016/0091560 A1* | 3/2016 | Chien ...................... H03K 5/26 |
| | | 324/750.3 |
| 2017/0254846 A1* | 9/2017 | Cher .................... G01R 19/165 |
| 2019/0293695 A1* | 9/2019 | Guthrie .............. G01R 19/0038 |
| 2020/0233032 A1* | 7/2020 | Carminati ........ G01R 31/31922 |

* cited by examiner

PROCESS VARIATION DETECTION CIRCUIT AND PROCESS VARIATION DETECTION METHOD

CROSS-REFERENCE TO RELATED APPLICATIONS

The present application is a national stage of International Patent Application No. PCT/CN2021/105325, filed on Jul. 8, 2021, which claims the priority to Chinese Patent Application No. 202011550999.9, titled "Process Variation Detection Circuit and Process Variation Detection Method", filed on Dec. 24, 2020. The entire contents of International Patent Application No. PCT/CN2021/105325 and Chinese Patent Application No. 202011550999.9 are incorporated herein by reference.

TECHNICAL FIELD

The present disclosure relates to, but is not limited to, a process variation detection circuit and a process variation detection method.

BACKGROUND

Various parameters of the chip need to be measured before delivery to obtain manufacturing process data, such as process variations, which facilitate quality inspection and provide data support for subsequent apparatus improvements and processes.

In the related art, it is common practice to measure the delay time of the transistor to measure the process angle of the chip, but the process variation of other parameters, for example, the process variation of gate capacitance of the transistor, the process variation of transmission gate resistance or the process variation of resistance of each metal layer in the chip, cannot be further measured. Therefore, there is a need for a process variation detection circuit and a process variation detection method to measure more parameters.

The information disclosed in the background art is only used to enhance an understanding of the background of the present disclosure, and thus may include information that does not constitute prior art known to those of ordinary skill in the art.

SUMMARY

The following is a summary of a subject that is described in detail herein. This summary is not intended to limit the scope of protection of the claims.

In a first aspect of the present disclosure, a process variation detection circuit arranged in a chip is provided, and the process variation detection circuit includes:

a first ring oscillator, wherein a first number of auxiliary elements of a preset type are arranged between two adjacent inverters of the first ring oscillator; and a second ring oscillator, wherein a second number of auxiliary elements of a preset type are arranged between two adjacent inverters of the second ring oscillator, the second number is larger than the first number;

wherein, a number of the inverter of the first ring oscillator is the same as a number of the inverter of the second ring oscillator; a type and a size of a transistor of the first ring oscillator are the same as a type and a size of a transistor of the second ring oscillator, and a type and a connection mode of the auxiliary element correspond to element parameters to be measured of the chip.

In a second aspect of the present disclosure, a process variation detection circuit arranged in a chip is provided, and the process variation detection circuit includes:

a first ring oscillator, where two adjacent inverters of the first ring oscillator are connected by a first wire, the first wire is made of metal of an i-th metal layer of the chip, and $i \geq 1$; and a second ring oscillator, where two adjacent inverters of the second ring oscillator are connected by a second wire, and the second wire includes a first portion, a second portion and a third portion, the first portion is the first wire, the second portion is made of through-hole metal connected to the i-th metal layer and an (i+1)-th metal layer of the chip, and the third portion is made of metal of the (i+1)-th metal layer; and a number of the inverter of the first ring oscillator is the same as a number of the inverter of the second ring oscillator; a type and a size of a transistor of the first ring oscillator are the same as a type and a size of a transistor of the second ring oscillator; and a type and a connection mode of the auxiliary element correspond to element parameters to be measured of the chip.

In a third aspect of the present disclosure, a process variation detection method applied to the above process variation detection circuit is provided, and the process variation detection method includes:

obtaining a first measured oscillation period of a first ring oscillator and a second measured oscillation period of a second ring oscillator corresponding to each of the M chips, where the M chips correspond to the same one wafer, in the M chips, the first ring oscillators are the same, the second ring oscillators are the same, and $M \geq 1$;

determining a difference between the second measured oscillation period and the first measured oscillation period of each chip as a measured oscillation period difference of each chip;

determining a reference oscillation period difference according to M measured oscillation period difference of the M chips; and determining a process variation detection result of an element parameter to be measured of the target chip according to the reference oscillation period difference and the measured oscillation period difference of the target chip.

In a fourth aspect of the present disclosure, a process variation detection method applied to the above process variation detection circuit is provided, and the process variation detection method includes:

obtaining a first measured oscillation period of a first ring oscillator and a second measured oscillation period of a second ring oscillator corresponding to each of the M chips, where the M chips correspond to the same one wafer, in the M chips, the first ring oscillators are the same, the second ring oscillators are the same, and $M \geq 1$;

determining a difference value between the second measured oscillation period and the first measured oscillation period of each chip as a measured oscillation period difference of each chip;

determining a reference oscillation period difference according to M measured oscillation period difference of the M chips; and determining a process variation detection result of resistance of through-hole metal and metal of an (i+1)-th metal layer according to the reference oscillation period difference and the measured oscillation period difference of the target chip.

BRIEF DESCRIPTION OF THE DRAWINGS

The accompanying drawings, which are incorporated in and constitute a part of this specification, illustrate embodiments of the present disclosure and, together with the description, serve to explain principles of the embodiments of the present disclosure. In the accompanying drawings, similar reference numerals are used to indicate similar elements. The accompanying drawings in the following description are of some, but not all, embodiments of the present disclosure. Those skilled in the art may derive other accompanying drawings from these accompanying drawings without paying creative work.

One or more embodiments are illustrated by way of example in figures of the accompanying drawings, which are not to be construed as limiting the embodiments, elements having the same reference numeral designations in the accompanying drawings represent similar elements, and the figures in the accompanying drawings are not to scale unless otherwise indicated.

The accompanying drawings, which are incorporated in and constitute a part of this specification, illustrate embodiments consistent with the present disclosure and, together with the description, serve to explain the principles of the present disclosure. Apparently, the accompanying drawings in the following description show merely some embodiments of the present disclosure, and other drawings can be derived from these accompanying drawings by those of ordinary skill in the art without creative efforts.

DETAILED DESCRIPTION

Embodiments will now be described more comprehensively with reference to the accompanying drawings. The embodiments may be embodied in many forms and should not be construed as limited to the examples set forth herein; rather, these embodiments are provided so that the present disclosure will be thorough and complete, and will fully convey the concept of the embodiments to those skilled in the art. The described features, structures, or characteristics may be combined in any suitable manner in one or more embodiments. In the following description, numerous specific details are provided to give a thorough understanding of the embodiments of the present disclosure. However, those skilled in the art will appreciate that the technical solution of the present disclosure may be practiced without one or more of the specific details, or that other methods, components, devices, steps, etc. may be employed. In other instances, well-known technical solutions have not been shown or described in detail to avoid obscuring aspects of the disclosure.

Further, the accompanying drawings are merely schematic illustrations of the present disclosure, in which the same reference numerals denote the identical or similar parts, and thus repeated descriptions thereof will be omitted. Some of the block diagrams shown in the accompanying drawings are functional entities and do not necessarily have to correspond to physically or logically separate entities. These functional entities may be implemented in software form, or in one or more hardware modules or integrated circuits, or in different network and/or processor devices and/or microcontroller devices.

An implementation of the present disclosure is described in detail below in conjunction with the accompanying drawings.

Figure 1:
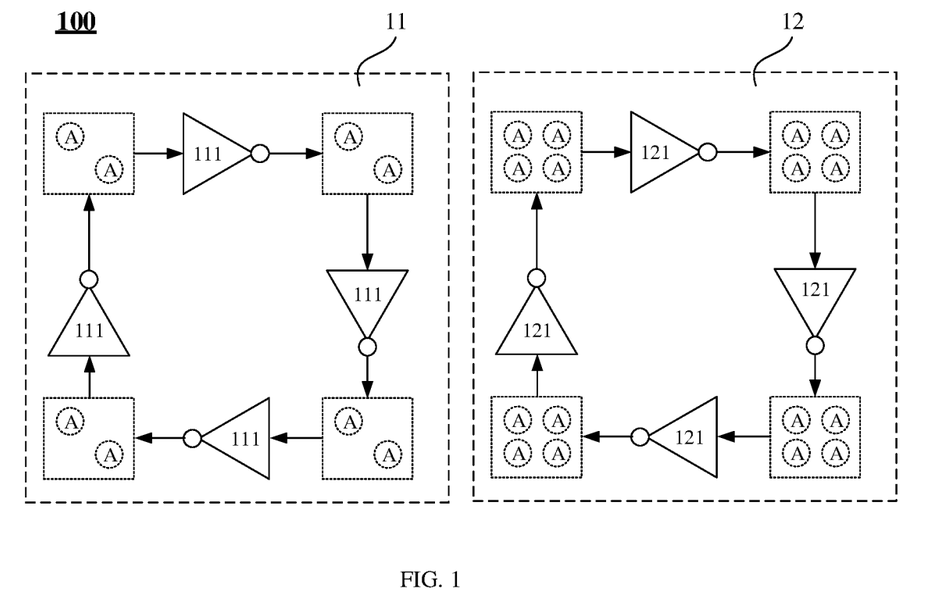
FIG. 1 is a structural schematic diagram of a process variation detection circuit in an illustrative embodiment of the present disclosure.

FIG. 1 is a structural schematic diagram of a process variation detection circuit in an illustrative embodiment of the present disclosure.

With reference to FIG. 1, the process variation detection circuit 100 arranged in a chip 1 may include:

a first ring oscillator 11, where a first number N1 of auxiliary elements A of a preset type are arranged between two adjacent inverters 111 of the first ring oscillator 11; and a second ring oscillator 12, where a second number N2 of the auxiliary elements A of a preset type are arranged between two adjacent inverters 121 of the second ring oscillator 12, the second number N2 is larger than the first number N1; and the number of the inverter of the first ring oscillator 11 is the same as the number of the inverter of the second ring oscillator 12; and a type and a size of a transistor of the first ring oscillator 11 are the same as a type and a size of a transistor of the second ring oscillator 12, and a type and a connection mode of the auxiliary element A correspond to element parameters to be measured of the chip.

In some embodiments, the type of the transistor of the auxiliary element A is the same as the type of the transistor of the inverter (inverter 111 or inverter 121) in each ring oscillator. In other embodiments, the type of the transistor of the auxiliary element A is not exactly the same as the type of the transistor of the inverter (inverter 111 or inverter 121) in each ring oscillator. The number of auxiliary element A in the embodiment shown in FIG. 1 is merely exemplary, and the present disclosure is not limited to this.

The circuit shown in FIG. 1 is exemplified by specific embodiments below.

Figure 2:
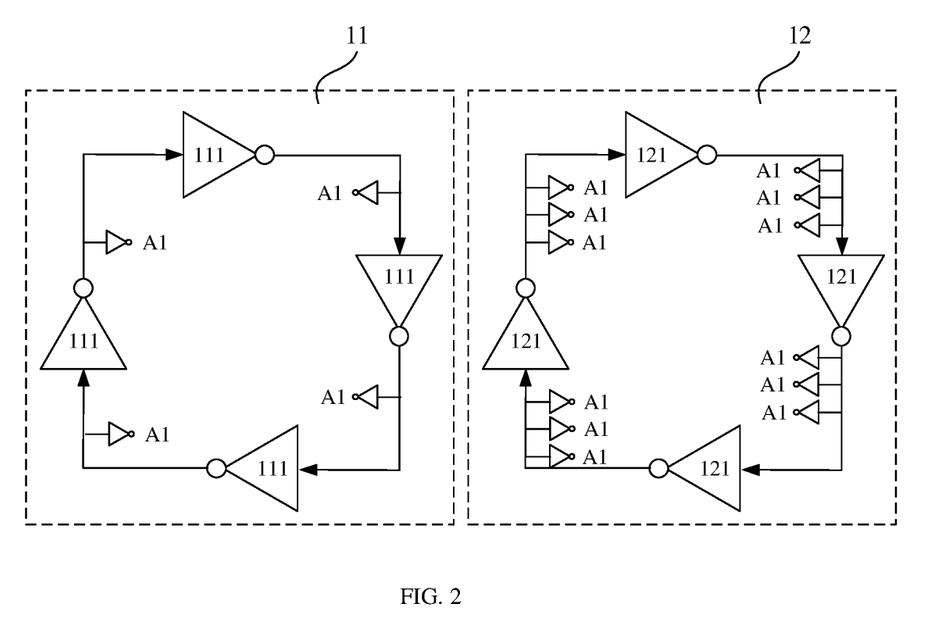
FIG. 2 is a schematic diagram of a process variation detection circuit 100 for measuring gate capacitance of a transistor in one embodiment of the present disclosure.

FIG. 2 is a schematic diagram of a process variation detection circuit 100 for measuring gate capacitance of a transistor in one embodiment of the present disclosure.

With reference to FIG. 2, when the element parameters to be measured include the gate capacitance of the transistor, the auxiliary element of a preset type may be, for example, a load inverter, that is, an inverter acting as a load. An output end of each inverter 111 of the first ring oscillator 11 is connected to input ends of a first number N1 of the load inverters A1, and an output end of each inverter 121 of the second ring oscillator 12 is connected to input ends of a second number N2 of the load inverters A1, and an output end of each load inverter A1 floats.

In the embodiment shown in FIGS. 2, N1=1, and N2=3. In other embodiments, the first number N1 and the second number N2 may be other values, and the present disclosure is not limited to this.

The gate capacitance of the load inverter adds the load to the output end of the inverter of the ring oscillator, so as to prolong an oscillation period of the ring oscillator. The more the load inverter connected to one ring oscillator is, the larger total gate capacitance is, and the longer the oscillation period is increased. When the number and the position of the load inverters separately connected to the two ring oscillators belonging to the two chips are completely same, the oscillation period of the ring oscillator is influenced by both the transistor of the inverter and the transistor of the load inverter due to the influence of certain process variation in a manufacturing process of each chip. Therefore, in the embodiment of the present disclosure, two ring oscillators connected to different numbers of load inverters A1 are arranged in the same chip, so as to evaluate the process variation of the gate capacitance of the load inverters of the target chip by measuring a measured oscillation period difference of the two ring oscillators of the target chip, thereby overcoming the influence of the process variation of the inverter of each chip on the measured oscillation period of the ring oscillator. Since the inverter consists of the N-type transistor and the P-type transistor, the process variation of the gate capacitance of the transistor of the target chip may be evaluated by evaluating the process variation of the gate capacitance of the load inverter.

For accurately measuring the process variation of the gate capacitance, the types of the P-type transistor and the N-type transistor of the load inverter are completely same. In one embodiment, the types of the P-type transistor and the N-type transistor of the load inverter are completely the same as those of the P-type transistor and the N-type transistor of the inverter connected to the load inverter. In another embodiment, the types of the P-type transistor and the N-type transistor of the load inverter may also not be exactly the same as those of the P-type transistor and the N-type transistor of the inverter connected to the load inverter. In addition, the ring oscillator in the embodiment of the present disclosure may be a symmetric ring oscillator (the type of the P-type transistor and the type of the N-type transistor of the inverter are completely same) or an asymmetric ring oscillator (the type of the P-type transistor and the type of the N-type transistor of the inverter are not completely same), which is not specially limited in the present disclosure.

In other embodiments of the present disclosure, other types of auxiliary elements (for example, a separate P-type transistor or a separate N-type transistor) may also be used in parallel to the output end of the inverter to measure the gate capacitance of the transistor, or only connected to the output of one or more inverters of a particular sequence number in each ring oscillator. Similarly, when the element parameters to be measured include other types of capacitance, an auxiliary element of a corresponding type may be connected to the ring oscillator. That is, the process variation detection circuit 100 may be used to measure the process variations of various capacitance in the chip.

The process variation detection circuit 100 may be used for measuring the process variation of a resistance type of element in addition to being used for measuring the process variation of a capacitance type of element in a chip.

Figure 3:
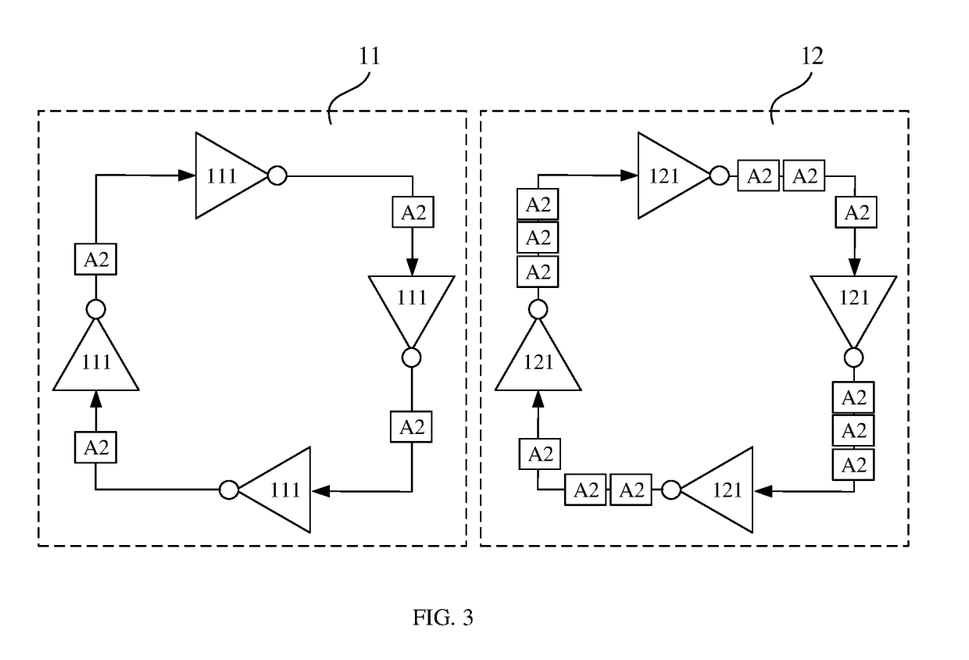
FIG. 3 is a schematic diagram of the process variation detection circuit 100 for measuring resistance of a transmission gate in one embodiment of the present disclosure.

FIG. 3 is a schematic diagram of the process variation detection circuit 100 for measuring resistance of a transmission gate in one embodiment of the present disclosure.

With reference to FIG. 3, when the element parameters to be measured include equivalent resistance of a transmission gate, the auxiliary element, for example, may be the transmission gate, a first number N1 of the transmission gates A2 are connected in series between two adjacent inverters 111 of the first ring oscillator 11, and a second number N2 of the transmission gates A2 are connected in series between two adjacent inverters 121 of the second ring oscillator 12.

In the embodiment shown in FIGS. 3, N1=1, and N2=3. In other embodiments, a difference between N2 and N1 may be increased to improve measurement accuracy, or N1 and N2 may be increased simultaneously.

Figure 4:
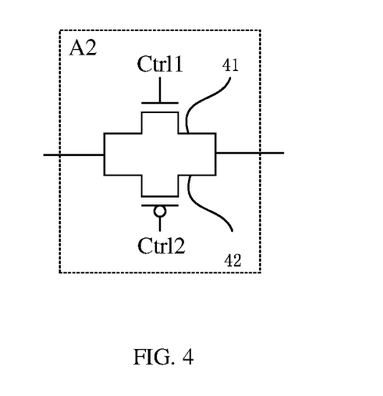
FIG. 4 is a schematic diagram of a transmission gate A2 in one embodiment of the present disclosure.

FIG. 4 is a schematic diagram of a transmission gate A2 in one embodiment of the present disclosure.

With reference to FIG. 4, the transmission gate A2 is formed by connecting one N-type transistor 41 and one P-type transistor 42 in parallel, the N-type transistor 41 and the P-type transistor 42 are the same in type, a source electrode of the N-type transistor 41 is connected to a drain electrode of the P-type transistor 42, a drain electrode of the N-type transistor 41 is connected to a source electrode of the P-type transistor 42, a gate of the N-type transistor 41 is connected to a first control signal Ctrl1, and the first control signal Ctrl1 is used for controlling the N-type transistor 41 to be switched on or off; and a gate of the P-type transistor 42 is connected to a second control signal Ctrl2, the second control signal Ctrl2 is used for controlling the P-type transistor 42 to be switched on or off, and the second control signal Ctrl2 is opposite the first control signal Ctrl1 in phase. During testing, the first control signal Ctrl1 is at a high level, and the second control signal Ctrl2 is at a low level, so as to respectively control the N-type transistor 41 and the P-type transistor 42 to be switched on.

In the embodiment shown in FIG. 4, the N-type transistor 41 is a negative channel metal oxide semiconductor (NMOS), and the P-type transistor 42 is a positive channel metal oxide semiconductor (PMOS). In other embodiments, the N-type transistor 41 may also be an NPN-type triode, and the P-type transistor 42 may be a PNP-type triode.

After the transmission gates (each transmission gate is switched on) are connected in series between the two adjacent inverters of the ring oscillator, the measured oscillation period of the ring oscillator is increased due to the fact that the transmission gates have the on resistance, and the more the transmission gate connected in series to one ring oscillator, the larger the measured oscillation period is increased. When the number and the position of the transmission gates separately connected to the two ring oscillators belonging to the two chips are completely same, the oscillation period of the ring oscillator is influenced by both the transistor of the inverter and the transistor of the transmission gate due to the influence of certain process variation in a manufacturing process of each chip. Therefore, in the embodiment of the present disclosure, two ring oscillators connected to different numbers of transmission gates A2 are arranged in the same chip, so as to evaluate the resistance of the transmission gate of the target chip, that is, the process variation of the resistance of the transmission gate of the target chip, by measuring a measured oscillation period difference of the two ring oscillators of the target chip, thereby overcoming the influence of the process variation of the inverter of each chip on the measured oscillation period of the ring oscillator.

In one embodiment, the types of the P-type transistor and the N-type transistor of the transmission gate are completely the same as those of the P-type transistor and the N-type transistor of the inverter connected to the load inverter. In another embodiment, the types of the P-type transistor and the N-type transistor of the transmission gate is not exactly the same as those of the P-type transistor and the N-type transistor of the inverter connected to the transmission gate. In addition, the ring oscillator in the embodiment of the present disclosure may be a symmetric ring oscillator (the type of the P-type transistor and the type of the N-type transistor of the inverter are completely same) or an asymmetric ring oscillator (the type of the P-type transistor and the type of the N-type transistor of the inverter are not completely same), which is not specially limited in the present disclosure.

In other embodiments of the present disclosure, the resistance of the transmission gate may also be measured by using other connection modes of the transmission gate, for example, the plurality of transmission gates are connected to the ring oscillator by the plurality of connection modes including series connection, parallel connection, etc., or the transmission gate is only connected between two or more adjacent inverters of a specific sequence number of the ring oscillator, and so on. Similarly, when the element parameters to be measured include other types of resistance, the auxiliary element of the corresponding type may be connected to the ring oscillator. That is, the process variation detection circuit 100 may be used to measure the process variations of various resistance in the chip.

When the process variations of the various element parameters to be measured is measured, the plurality of detection circuits may be arranged in the same chip, each of the detection circuits corresponds to one auxiliary element, and each of the detection circuits is used for measuring the process variation of one element parameter to be measured.

Figure 5:
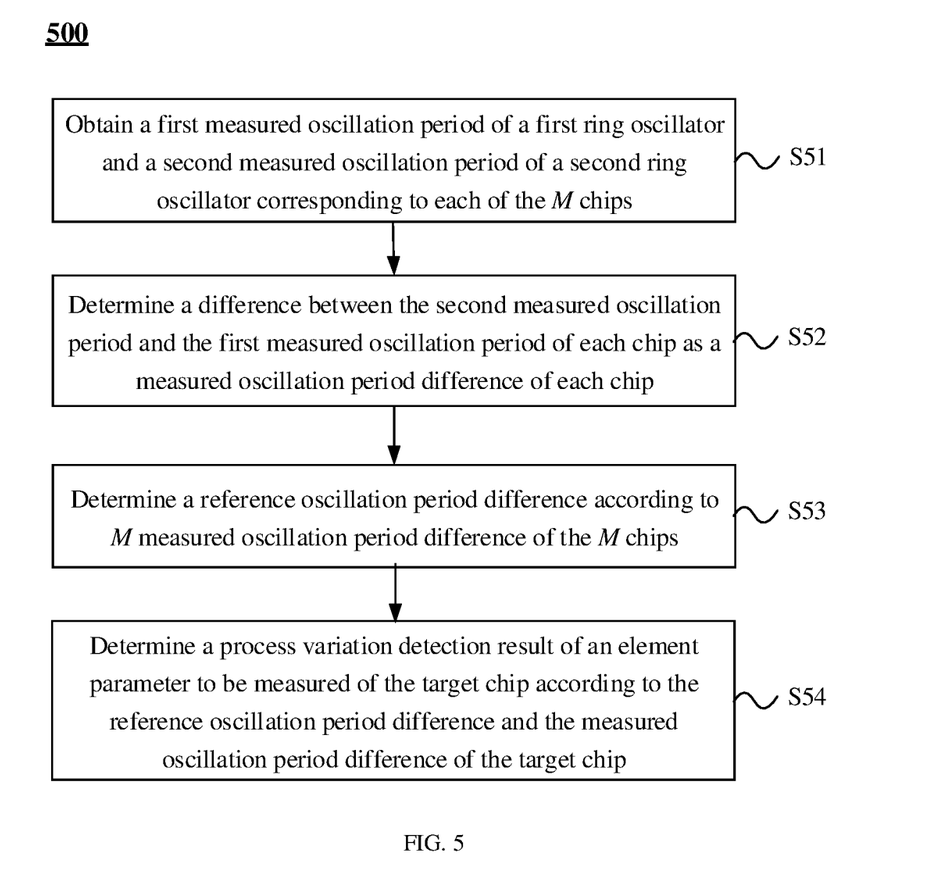
FIG. 5 is a flow chart of a process variation detection method in an embodiment of the present disclosure.

FIG. 5 is a flow chart of a process variation detection method in an embodiment of the present disclosure. The detection method shown in FIG. 5 may be implemented by the circuit as shown in any of the embodiments of FIGS. 1-3.

With reference to FIG. 5, the process variation detection method 500 may include:

S51, a first measured oscillation period of a first ring oscillator and a second measured oscillation period of a second ring oscillator corresponding to each of the M chips are obtained, where the M chips correspond to the same one wafer, in the M chips, the first ring oscillators are the same, the second ring oscillators are the same, and M≥1;

S52, a difference between the second measured oscillation period and the first measured oscillation period of each chip is determined as a measured oscillation period difference of each chip;

S53, a reference oscillation period difference is determined according to M measured oscillation period difference of the M chips; and S54, a process variation detection result of an element parameter to be measured of the target chip is determined according to the reference oscillation period difference and the measured oscillation period difference of the target chip.

In S51 and S52, in order to avoid the influence of the process variation of the inverters of the ring oscillators of different chips on the test result of the auxiliary element, a difference of the measured oscillation period of the ring oscillator of the same chip is calculated, so as to determine the parameter, only related to the process parameter to be measured of the auxiliary element, of one chip.

In this embodiment of the present disclosure, the M chips belong to the same one wafer and have completely identical structures, such that the process variation of one wafer may be tested by detecting the process variation of one or more parameters of the element of each of the M chips in the wafer, thereby improving the process or an apparatus according to the process variations of the plurality of wafers.

In S53, an average value of the M measured oscillation period difference may be set as the reference oscillation period difference. In other embodiments, a median or a mode of the M measured oscillation period difference may also be set as the reference oscillation period difference, or the M measured oscillation period difference may be substituted into other preset formulas to determine the reference oscillation period difference, which is not specially limited in the present disclosure.

In S54, a difference between the measured oscillation period difference of the target chip and the reference oscillation period difference may be obtained; and it is determined that the element parameter to be measured of the target chip is larger, when the difference is larger than zero; it is determined that the element parameter to be measured of the target chip is smaller, when the difference is smaller than zero; or it is determined that the element parameter to be measured of the target chip is standard, when the difference is equal to zero.

When the element parameter to be measured is the gate capacitance of the transistor, the auxiliary element may be, for example, a load inverter. At the moment, when the measured oscillation period difference of the target chip is smaller than the reference difference value, the gate capacitance of the transistor of the target chip is smaller; when the measured oscillation period difference of the target chip is larger than the reference difference value, the gate capacitance of the transistor of the target chip is larger; and when the measured oscillation period difference of the target chip is equal to the reference difference value, the gate capacitance of the transistor of the target chip is standard.

When the element parameter to be measured is the resistance of the transmission gate, the auxiliary element may be, for example, the transmission gate. At the moment, when the measured oscillation period difference of the target chip is smaller than the reference difference value, the resistance of the transmission gate of the target chip is smaller; when the measured oscillation period difference of the target chip is larger than the reference difference value, the resistance of the transmission gate of the target chip is larger; and when the measured oscillation period difference of the target chip is equal to the reference difference value, the resistance of the transmission gate of the target chip is standard.

In addition to obtaining the comparison results of larger, smaller and standard values, statistical data of the process variations of the M chips may be obtained according to the distribution of the measured oscillation period difference corresponding to each of the M chips. For example, the process variation of the wafer, corresponding to the M chips, on one element parameter to be measured may be determined according to a variance or a standard deviation of the M measured oscillation period difference of the M chips. In addition, a plurality of sets of ring oscillators corresponding to different types of auxiliary elements may be arranged on the chip to evaluate a plurality of element parameters to be measured, and then the process variation of one wafer is comprehensively evaluated from multiple dimensions by the plurality of element parameters to be measured of the M chips.

In addition to measuring the element parameters, the embodiment of the present disclosure provides a process variation detection circuit for measuring the process variation of a parameter of a semiconductor process layer.

Figure 6:
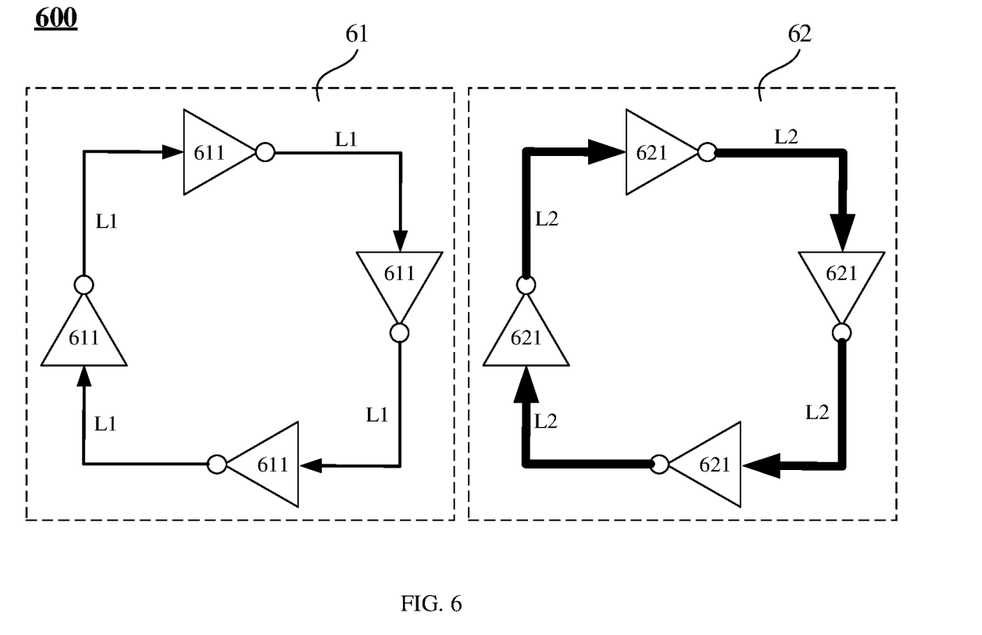
FIG. 6 is a schematic diagram of a process variation detection circuit in another embodiment of the present disclosure.

FIG. 6 is a schematic diagram of a process variation detection circuit in another embodiment of the present disclosure.

With reference to FIG. 6, the process variation detection circuit 600 may include:

a first ring oscillator 61, where two adjacent inverters 611 of the first ring oscillator 61 are connected by a first wire L1, the first wire L1 is made of metal of an i-th metal layer of the chip, and i≥1; and a second ring oscillator 62, where two adjacent inverters 621 of the second ring oscillator 62 are connected by a second wire L2, and the second wire L2 includes a first portion, a second portion and a third portion, the first portion is the first wire, the second portion is made of through-hole metal connected to the i-th metal layer and an (i+1)-th metal layer of the chip, and the third portion is made of metal of the (i+1)-th metal layer; and where the number of the inverter 611 of the first ring oscillator 61 is the same as the number of the inverter 621 of the second ring oscillator 62; and a type and a size of a transistor of the first ring oscillator 61 are the same as a type and a size of a transistor of the second ring oscillator 62.

Figure 7A:
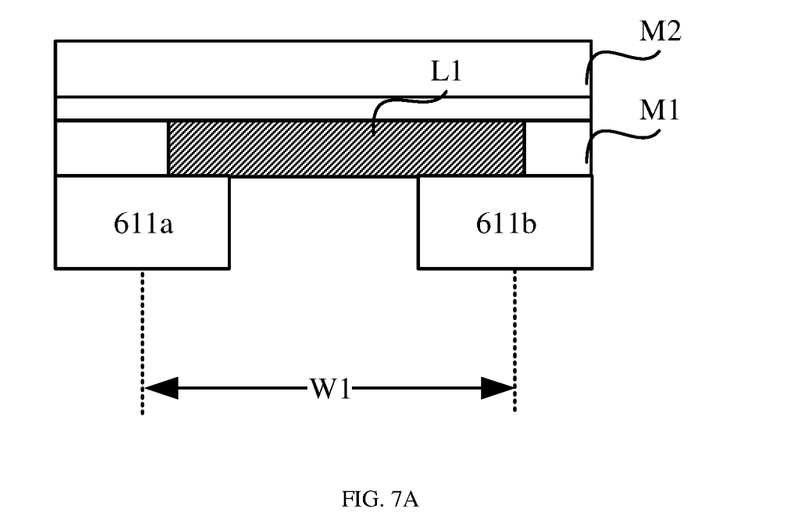
FIG. 7A is a schematic diagram of a first wire in the embodiment shown in FIG. 6.

FIG. 7A is a schematic diagram of a first wire in the embodiment shown in FIG. 6.

Since a structure of the inverter is well known in the art, the embodiments of the present disclosure only use a box to represent the inverter for convenience of illustration.

The first wire L1 is used for connecting the inverters of the first ring oscillator 61. With reference to FIG. 7A, in a chip cross-sectional view, a first end of the first wire L1 is connected to the output end (the drain electrode of the transistor) of the first inverter 611*a* of the first ring oscillator 61, a second end thereof is connected to the input end (the gate of the transistor) of the second inverter 611*b* of the first ring oscillator 61, the first inverter 611*a* and the second inverter 611*b* may be any two adjacent inverters of the first ring oscillator 61, and reference numerals are used for illustration only.

The structures and transistor types of the first inverter 611*a* and the second inverter 611*b* are the same, and each consists of one N-type transistor and one P-type transistor. A first metal layer M1 and a second metal layer M2 are provided above the first inverter 611*a* and the second inverter 611*b* in sequence.

The first wire L1 is located on the first metal layer M1, the first end is connected to the output end (the drain electrode of the transistor) of the first inverter 611*a*, and the second end is connected to the input end (the gate of the transistor) of the second inverter 611*b*. Spacing between the first inverter 611*a* and the second inverter 611*b* is W1.

Figure 7B:
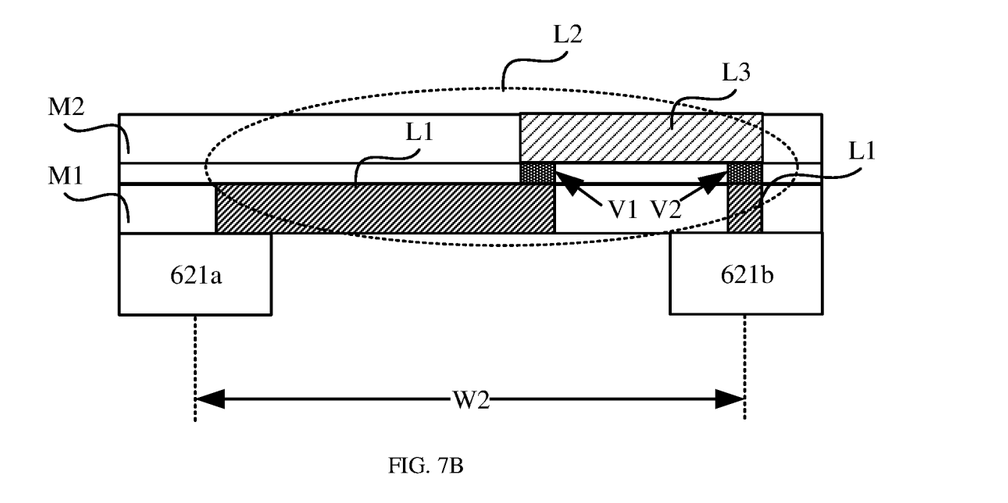
FIG. 7B is a schematic diagram of a second wire in the embodiment shown in FIG. 6.

FIG. 7B is a schematic diagram of a second wire in the embodiment shown in FIG. 6.

The second wire L2 is used for connecting the inverters of the second ring oscillator 62. With reference to FIG. 7B, in a chip cross-sectional view, a first end of the second wire L2 is connected to the output end of the first inverter 621*a* of the second ring oscillator 62, a second end thereof is connected to the input end of the second inverter 621*b* of the second ring oscillator 62, and the first inverter 621*a* and the second inverter 621*b* may be any two adjacent inverters of the second ring oscillator 62.

In the embodiment shown in FIG. 7B, the second wire L2 consists of the first wire L1, a first through hole V1, a second through hole V2, and a third wire L3, where the first wire L1 consists of two portions which make indirect contact, since the two portions are separately connected to the output end of the first inverter 621*a* and the input end of the second inverter 621*b*, a first end of the third wire L3 is connected to a left portion of the first wire L1 by the first through hole V1, and a second end thereof is connected to a right portion of the first wire L1 by the second through hole V2. Although the first wire L1 is divided into two portions, the two portions have equal width which is equal to a width of the first wire L1 in FIG. 7A, and a total length is equal to a length of the first wire L1 in FIG. 7A. In the embodiment shown in FIG. 7B, a length of the left portion of the first wire L1 is larger than a length of the right portion. In other embodiments of the present disclosure, the lengths of the left portion and the right portion of the first wire L1 of the second ring oscillator may be proportionate, as long as the total length of the left portion and the right portion is equal to the length of the first wire L1 of the first ring oscillator corresponding to the second ring oscillator.

In correspondence to FIG. 7A, in FIG. 7B, the output end of the first inverter 621*a* is connected to a first end of the left portion of the first wire L1 located on the first metal layer M1, a second end of the left portion of the first wire L1 is connected to a first end of the third wire L3 by the first through hole V1 provided between the first metal layer M1 and the second metal layer M2, the third wire L3 is located on the second metal layer M2, a second end of the third wire L3 is connected to the second through hole V2 provided between the first metal layer and the second metal layer, and the second through hole V2 is connected to the input end of the second inverter 621*b* by the right portion of the first wire L1.

Spacing between the first inverter 621*a* and the second inverter 621*b* is W2. In one embodiment, W2>W1, since the first wire L1 is same in both ring oscillators, the second wire L2 may be a straight line from a top view. In one embodiment, W2=W1, since the first wire L1 is same in both ring oscillators, the second wire L2 may be a curve from the top view.

Figure 8:
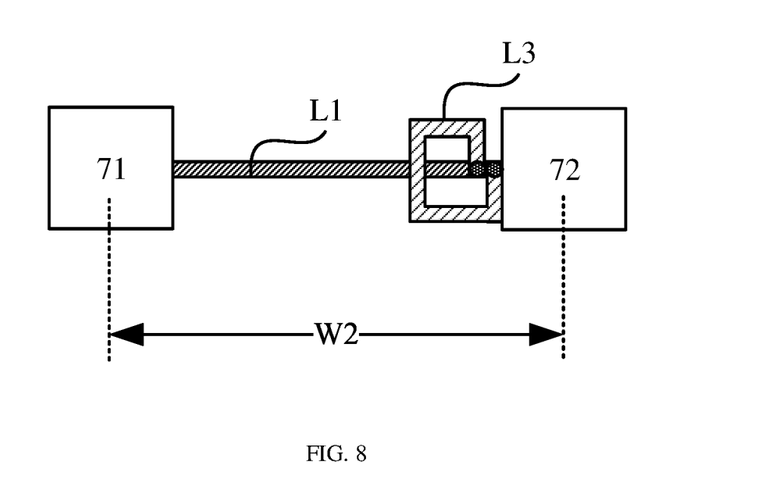
FIG. 8 is a top view of an actual form of a second wire in one embodiment of the present disclosure.

FIG. 8 is a top view of an actual form of a second wire L2 in one embodiment of the present disclosure.

With reference to FIG. 8, when the spacing W2 of the inverters of the second ring oscillator is equal to the spacing W1 of the inverters of the first ring oscillator, the third wire L3 of the second wire L2 is a curve. In other embodiments of the present disclosure, the third wire L3 may also have other shapes and lengths, as long as the remaining portion of the second wire L2 remains consistent with the first wire L1 except for the measured portion (for example, the third wire L3 consisting of the second metal layer M2, the first through hole V1, and the second through hole V2), for example, the difference between the second wire L2 in FIG. 7B and the first wire L1 in FIG. 7A.

In the embodiment shown in FIGS. 7A, 7B and 8, the first wire L1 is located on the first metal layer M1. In other embodiments, the first wire L1 may also be located on another metal layer, or the first wire L1 may also consist of a plurality of portions located on the plurality of metal layers, or the first wire L1 may also consist of the plurality of portions, located on the plurality of metal layers, making indirect communication with one another. Since the first wire L1 is mainly used for assisting in calculating the resistance of the third wire L3 and the through-hole metal, the specific arrangement mode of the first wire L1 is not important, and those skilled in the art may design it by themselves according to actual conditions.

No matter what the actual arrangement of the first wire L1 is, the third wire L3 is arranged on a metal layer different from that where the first wire L1 is located, and one end of the third wire L3 always needs to be directly connected to the first wire L1 by the metal through hole. A transistor technology is diversified, in addition to the planar transistor (the gate, the drain electrode and the source electrode are arranged in parallel on the top view of the chip), a vertical transistor (the source electrode, the gate and the drain electrode are arranged in sequence from top to bottom on the cutaway view of the chip) is further provided, so the third wire L3 has many specific form types, which is not specially limited in the present disclosure.

Figure 9:
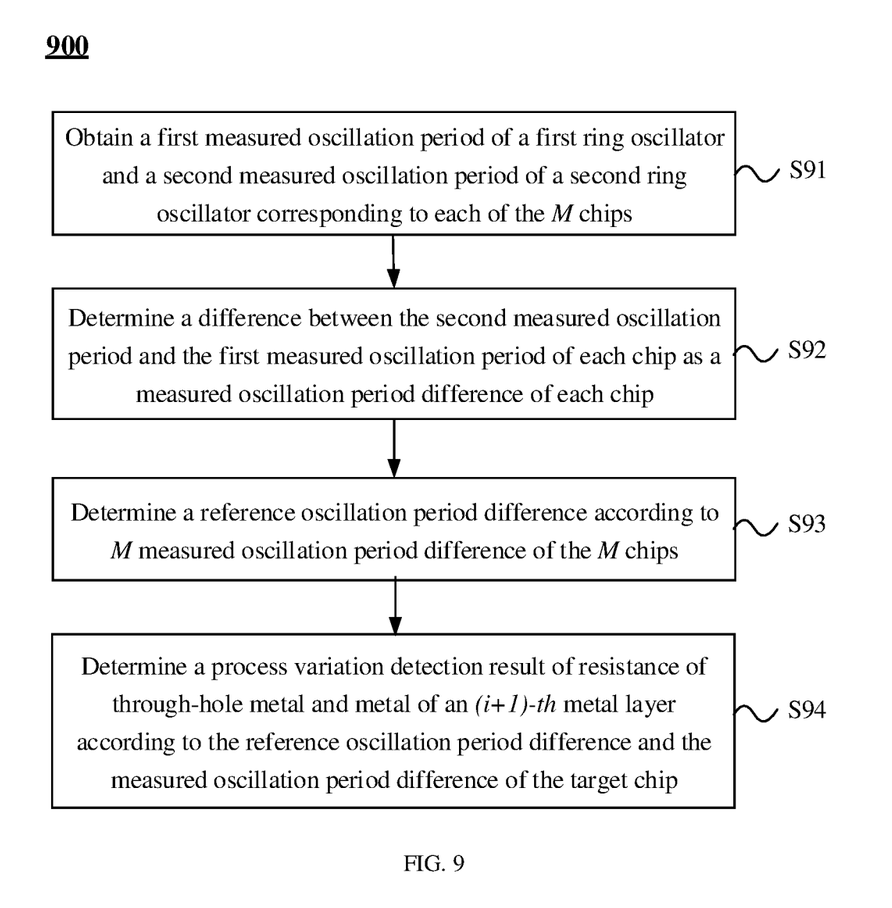
FIG. 9 is a flow chart of a process variation detection method in another embodiment of the present disclosure.

FIG. 9 is a flow chart of a process variation detection method provided in another embodiment of the present disclosure. The method shown in FIG. 9 may be implemented by the process variation detection circuit as shown in FIG. 6.

With reference to FIG. 9, the process variation detection method 900 may include:

S91, a first measured oscillation period of a first ring oscillator and a second measured oscillation period of a second ring oscillator corresponding to each of the M chips are obtained, where the M chips correspond to the same one wafer, in the M chips, the first ring oscillators are the same, the second ring oscillators are the same, and M≥1;

S92, a difference between the second measured oscillation period and the first measured oscillation period of each chip is determined as a measured oscillation period difference of each chip;

S93, a reference oscillation period difference is determined according to M measured oscillation period difference of the M chips; and S94, a process variation detection result of resistance of through-hole metal and metal of an (i+1)-th metal layer is determined according to the reference oscillation period difference and the measured oscillation period difference of the target chip.

In S91 and S92, the second wire L2 consisting of the first wire L1, the third wire L3, and the through-hole metal has larger resistance than that of the first wire L1. Therefore, the measured oscillation period of the second ring oscillator 62 is larger than the measured oscillation period of the first ring oscillator 61 on the same chip. In order to eliminate the influence of the first wire L1 and other structures on the measurement of the resistance of the third wire L3 and the metal through hole of the target chip, according to the embodiment of the present disclosure, the parameter related to the resistance of the third wire L3 only formed by the metal of the (i+1)-th metal layer and the resistance of the through-hole metal connected to the third wire L3 in one chip are represented by the difference value between the second ring oscillator 62 and the first ring oscillator 61.

In this embodiment of the present disclosure, the M chips belong to the same one wafer and have completely identical structures, such that the process variation of one wafer may be tested by detecting the process variation of resistance of a specific metal layer of each of the M chips in the wafer, thereby improving the process or an apparatus according to the process variations of the plurality of wafers.

In S93, an average value of the M measured oscillation period difference may be set as the reference oscillation period difference. In other embodiments, a median or a mode of the M measured oscillation period difference may also be set as the reference oscillation period difference, or the M measured oscillation period difference may be substituted into other preset formulas to determine the reference oscillation period difference, which is not specially limited in the present disclosure.

In S94, a difference between the measured oscillation period difference of the target chip and the reference oscillation period difference may be obtained; and it is determined that the resistance to be measured of the target chip is larger, when the difference is larger than zero; it is determined that the resistance to be measured of the target chip is smaller, when the difference is smaller than zero; or it is determined that the resistance to be measured of the target chip is standard, when the difference is equal to zero. The resistance to be measured is the resistance of the through-hole metal of the target chip and the metal of the (i+1)-th metal layer.

The embodiment not only may be used for measuring the process variation of the resistance of one metal layer and the through-hole metal connected thereto, but also may be used for measuring the process variation of the resistance of the plurality of metal layers and the through-hole metal connected thereto. In some embodiments, the plurality of sets of ring oscillators may be provided as shown in FIG. 6, each set of ring oscillators measures the process variation of the resistance of one metal layer and the through-hole metal connected thereto correspondingly, and one or more ring oscillators may be shared among the plurality of sets of ring oscillators. For example, the first set of ring oscillators of one chip may include ring oscillator A and ring oscillator B, and the second set of ring oscillators may include ring oscillator B and ring oscillator C. The ring oscillators A, B and C do not need to be physically grouped, only the measured periods of oscillation of the ring oscillators A, B and C need to be obtained during testing, the measured oscillation period of the ring oscillator B is repeatedly used for twice calculation, and then the process variations corresponding to the two sets of ring oscillators may be obtained.

In addition to obtaining the comparison results of larger, smaller and standard values, statistical data of the process variations of the M chips may be obtained according to the distribution of the measured oscillation period difference corresponding to each of the M chips. For example, the process variation of the wafer, corresponding to the M chips, on one metal layer may be determined according to a variance or a standard deviation of the M measured oscillation period difference of the M chips. In addition, the plurality of sets of ring oscillators (one or more ring oscillators may be shared among the plurality of sets of ring oscillators) corresponding to different process layers (including metal layers or non-metal layers) separately may be arranged on the chips so as to evaluate the resistance of the plurality of process layers, thereby comprehensively evaluating the process variations of the plurality of process layers of one wafer according to a resistance evaluation condition of the plurality of process layers of the M chips.

In conclusion, the connection between two adjacent inverters of the ring oscillator is modified, the measured oscillation period difference of the ring oscillators of the same type on the same chip may be detected and then the difference value is compared in the chip produced by the same one wafer, or the measured oscillation period difference corresponding to the same one wafer is directly counted, so as to obtain a plurality of process variation results corresponding to one wafer. When the plurality of sets of ring oscillators provided in the embodiment of the present disclosure are separately arranged on one chip, the various parameters (including the element parameters to be measured or the process layer parameters) in the wafer may be simultaneously measured, the process variation is accurately evaluated in detail, which provides powerful data support for improving the integrated circuit manufacturing process or apparatus.

It should be noted that although several modules or units of an apparatus for action execution are mentioned in the above detailed description, such division is not mandatory. Indeed, according to embodiments of the present disclosure, features and functions of two or more modules or units described above may be embodied in one module or unit. Conversely, the features and functions of one module or unit described above may be further divided into being embodied by multiple modules or units.

In the description of this specification, reference terms "an embodiment", "an illustrative embodiment", "some implementations", "an illustrative implementation", "an example", etc., mean that a particular feature, structure, material, or characteristic described in conjunction with the embodiment or example is included in at least one embodiment or example of the present disclosure.

In the present specification, schematic expression of the above terms do not necessarily refer to the same embodiment or example. Furthermore, the particular features, structures, materials, or characteristics described may be combined in a suitable manner in any one or more embodiments or examples.

In the description of the present disclosure, it is to be noted that the terms "central", "upper", "lower", "left", "right", "vertical", "horizontal", "inner", "outer", etc. indicate direction or positional relations based on those shown in the drawings only for ease of description of the present disclosure and for simplicity of description, and are not intended to indicate or imply that the referenced device or element must have a particular orientation and be constructed and operative in a particular orientation, and thus may not be construed as a limitation on the present disclosure.

It may be understood that the terms "first", "second", etc. as used in the present disclosure may be used to describe various structures in the present disclosure, but these structures are not limited by these terms. These terms are only used to distinguish a first structure from another structure.

In one or more accompanying drawings, the identical elements are denoted by the identical or similar reference numerals. For clarity, many parts in the accompanying drawings are not drawn to scale. In addition, certain well-known parts may not be shown. For brevity, a structure obtained after several steps may be described in one figure. Numerous specific details of the present disclosure are described below, for example, structures, materials, dimensions, processes, and techniques of devices in order to provide a clearer understanding of the present disclosure. However, as will be understood by those skilled in the art, the present disclosure may be practiced without these specific details.

Finally, it should be noted that the above embodiments are merely intended to illustrate the technical solution of the present disclosure and not to limit the same; although the present disclosure has been described in detail with reference to the foregoing embodiments, it should be understood by those skill in the art that the technical solutions described in the foregoing embodiments may be modified or equivalents may be substituted for some or all of the technical features thereof; and the modification or substitution does not make the essence of the corresponding technical solution deviate from the scope of the technical solution of each embodiment of the present disclosure.

INDUSTRIAL APPLICABILITY

The embodiment of the present disclosure provides a process variation detection circuit and a process variation detection method. By adding an auxiliary element or modifying a wire between adjacent inverters in a ring oscillator, a variation result of a process corresponding to the auxiliary element or the wire may be determined by measuring a measured oscillation period of the ring oscillator, so as to measure process variations of various parameters in a chip.

The invention claimed is:

1. A process variation detection circuit, arranged in a chip, and comprising:
a first ring oscillator, wherein a first number of auxiliary elements of a preset type are arranged between two adjacent inverters of the first ring oscillator; and
a second ring oscillator, wherein a second number of auxiliary elements of a preset type are arranged between two adjacent inverters of the second ring oscillator, the second number is larger than the first number;
wherein, a number of the inverters of the first ring oscillator is the same as a number of the inverters of the second ring oscillator; a type and a size of a transistor of the first ring oscillator are the same as a type and a size of a transistor of the second ring oscillator; and a type and a connection mode of each of the auxiliary elements correspond to element parameters to be measured of the chip.

2. The process variation detection circuit according to claim 1, wherein, the element parameters to be measured comprise gate capacitance of a transistor; each of the auxiliary elements of a preset type is a load inverter; an output end of each inverter of the first ring oscillator is connected to input ends of a first number of the load inverters, and an output end of each inverter of the second ring oscillator is connected to input ends of a second number of the load inverters, and an output end of each load inverter floats.

3. The process variation detection circuit according to claim 1, wherein, the element parameters to be measured comprise equivalent resistance of a transmission gate; each of the auxiliary elements is an transmission gate; a first number of the transmission gates are connected in series between the two adjacent inverters of the first ring oscillator, and a second number of the transmission gates are connected in series between the two adjacent inverters of the second ring oscillator.

4. The process variation detection circuit according to claim 1, wherein a type of a transistor of each of the auxiliary elements is the same as a type of a transistor of each of the inverters.

5. The process variation detection circuit according to claim 1, wherein a type of a transistor of each of the auxiliary elements is not exactly the same as a type of a transistor of each of the inverters.

* * * * *